United States Patent [19]

Reiner et al.

[11] Patent Number: 4,548,255

[45] Date of Patent: Oct. 22, 1985

[54] MOLD WITH STARTER AND SELECTOR SECTIONS FOR DIRECTIONAL SOLIDIFICATION CASTING

[75] Inventors: Martin J. Reiner, South Windsor, Conn.; Kenneth E. Taylor, Longmeadow, Mass.

[73] Assignee: United Technologies Corporation, Hartford, Conn.

[21] Appl. No.: 633,071

[22] Filed: Jul. 23, 1984

Related U.S. Application Data

[63] Continuation of Ser. No. 353,763, Mar. 1, 1982, abandoned.

[51] Int. Cl.$^4$ .............................................. B22C 9/02
[52] U.S. Cl. .................................. 164/361; 164/122.2
[58] Field of Search ............... 164/122, 122.1, 122.2, 164/125, 127, 348, 361

[56] References Cited

U.S. PATENT DOCUMENTS

| | | | |
|---|---|---|---|
| 34,021 | 8/1881 | Vishnevsky et al. | 428/224 |
| 1,793,672 | 2/1931 | Bridgman | 164/122.2 |
| 3,494,709 | 2/1970 | Piearcey | 416/232 |
| 3,536,121 | 10/1970 | Piearcey | 164/122.1 |
| 3,568,757 | 3/1971 | Piearcey | 164/363 |
| 3,572,419 | 3/1971 | Barrow et al. | 164/122.2 |
| 3,580,324 | 5/1971 | Copley | 164/122.2 |
| 3,763,926 | 10/1973 | Tschinkel et al. | 164/125 X |
| 4,111,252 | 9/1978 | Day et al. | 164/23 |
| 4,133,368 | 1/1979 | Hayes | 164/35 |

FOREIGN PATENT DOCUMENTS 0034021 8/1981 European Pat. Off. .

*Primary Examiner*—Nicholas P. Godici
*Assistant Examiner*—Richard K. Seidel
*Attorney, Agent, or Firm*—C. G. Nessler

[57] ABSTRACT

Directional solidification of a single crystal superalloy article may be accomplished using a mold with a starter section, and a selector section to convert columnar growth from the starter into single crystal growth. In such a process, the deviation of [001] crystallographic orientation with respect to the longitudinal axis of the article being formed is reduced from 9 degrees to 5 degrees by controlling the heat transfer in the starter section. A stepped starter section, wherein the lower subsection has a volume of 52-98% of the total starter volume, and wherein the upper subsection is relatively small in lateral dimension, has been found most useful. When the solidification interface moves into the smaller width upper subsection, it becomes more nearly planar, and results in improved columnar growth in the starter, and in reduction in the crystallographic deviation of the article.

6 Claims, 8 Drawing Figures

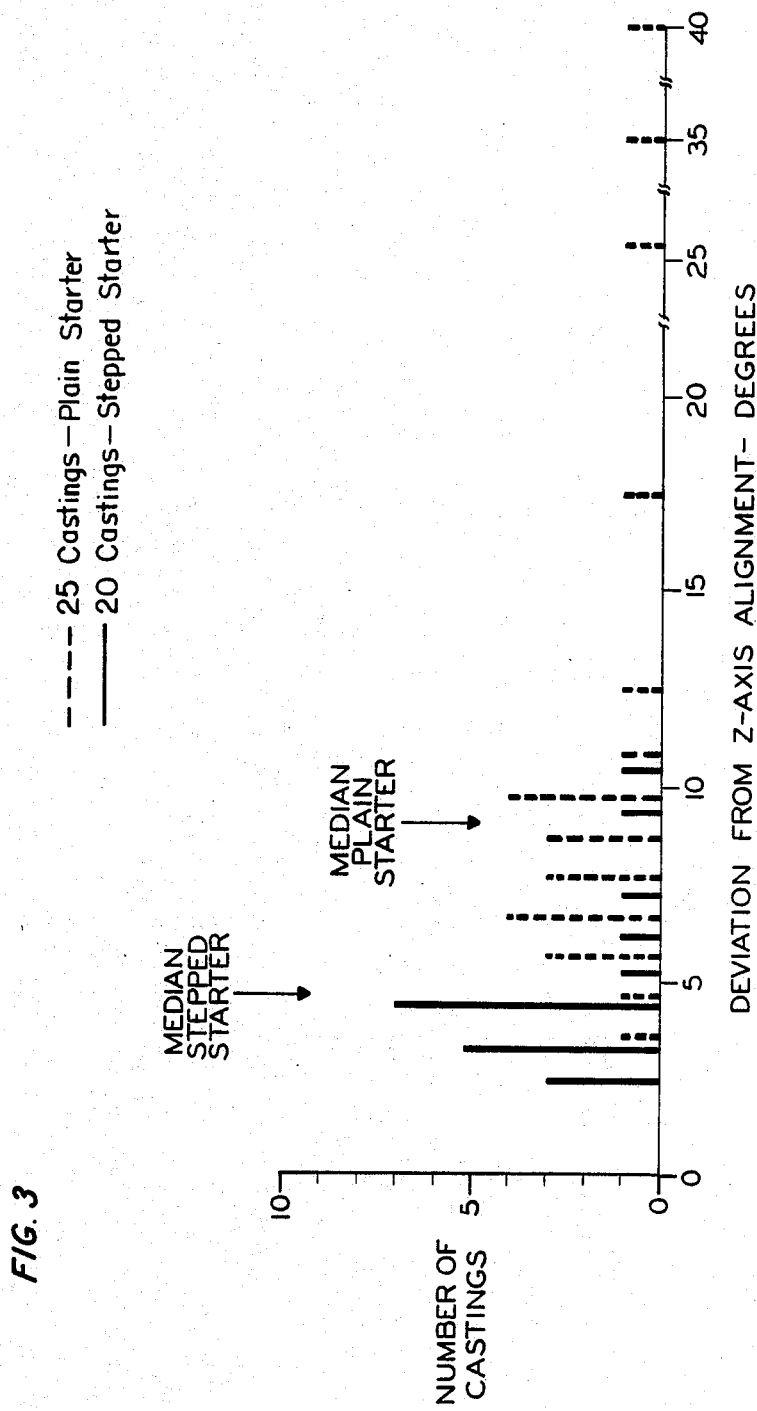

MOLD WITH STARTER AND SELECTOR SECTIONS FOR DIRECTIONAL SOLIDIFICATION CASTING

DESCRIPTION

This is a Continuation of Application Ser. No. 353,763 filed Mar. 1, 1982, now abandoned.

1. Technical Field

The present invention relates to the field of casting, more particularly to the directional solidification of single crystal structures.

2. Background

Directional solidification is a method of casting using controlled cooling to cause a solidification interface to move progressively through a mold filled with molten metal. In the highest technology embodiment of this process, single crystal articles are cast. There are several ways in which single crystal castings in useful shapes can be formed. In all of them a solidification interface moves through a casting. But the way in which the desired single crystal structure is initiated varies. In U.S. Pat. No. 1,793,672 Bridgman describes the use of narrow passages and seed crystals. The present invention is not concerned with seed crystals, and relies on the principle, used by Bridgman and in industry currently, of selecting one of a multiplicity of columnar grains, and propagating it as the single crystal structure of an article. In one approach, a mold has a passage small enough so that only one grain will pass through. In U.S. Pat. Nos. 3,494,709 and 3,536,121 to Piearcey, an improved method is shown wherein a zig-zag passage in a mold causes the rapid selection of a single grain from a multiplicity of columnar grains.

In a more refined practice, a helix shape is used, as shown in U.S. Pat. No. 4,111,252 to Day et al. and U.S. Pat. No. 4,133,368 to Hayes. The helix shape has been widely used in commerce. In practice, the mold has a helix positioned above a starter cavity just above the chill plate. When a heated mold is filled with molten metal, that which flows into the starter cavity instantly solidifies where it contacts the chill plate. But, inasmuch as the mold is at an elevated temperature, the solidification will only extend a short distance along the mold from the chill plate. Thereafter, a thermal gradient is moved progressively along the length of the casting, as by withdrawing the mold from a hot furnace. This causes movement of a solidification interface through the mold, causing columnar grain growth which is epitaxial from the original solidified metal. In a face centered cubic nickel superalloy, the crystals with [001] orientation will tend to grow faster than the other orientations. Thus [001] columns will tend to crowd out the other orientations and enter the helix at the top of the starter. Typically the solidification interface will be caused to move along the principal axis of the article; then the [001] orientation will be called the primary crystallographic orientation. As the solidification interface moves through the helix section of the mold, it is caused to translate in planes transverse to the primary axis. Thus, the helix converts the polycrystalline [001] columnar growth into a single crystal solidification interface. See related co-pending application Ser. No. 343,084 to Giamei et al. (of the present assignee), filed Jan. 27, 1982. Thereafter, the interface is caused to enter the article cavity, whereupon its further motion is used to form the desired article.

Generally, molds of the foregoing design work well in producing single crystal structures, as opposed to producing polycrystalline structures. However, there have always been difficulties associated with the helix. For example, the helix is relatively fragile and difficult to form. See the aforementioned Hayes and Day et al. patents. See also U.S. Pat. No. 4,180,119 of Burd et al., wherein the helix is caused to wrap around a ceramic support rod. It is a general object to minimize the vertical height of the starter cavity, helix, and associated structure, since it is desired to efficiently use the available vertical furnace height, by filling it with a mold which defines an article, as opposed to gating which is discarded after casting. However, in keeping the starter cavity and helix compact and close to the chill plate, problems arise in heating these parts. For example, PCT application Ser. No. 0.034,021 to Vishnevsky et al. shows the use of insulation around the starter cavity and helix.

As single crystal technology becomes more familiar in the manufacture of superalloy turbine blades and vanes for gas turbine engines, new discoveries are being made. These discoveries include awareness of criticalities which previously were not apparent, as well as solutions to old and new problems. The Piearcey U.S. Pat. No. 3,494,709, mentioned above, disclosed a useful superalloy single crystal turbine blade having the [001] crystal axis aligned within 20° of the principal or longitudinal axis of the blade. The [001] axis is preferred because of superior combination of creep strength and thermal fatigue resistance which it provides to gas turbine blades. However, more accurate and consistent alignment of [001] is often sought, compared to the broad utility of ±20 degrees taught by Piearcey. Further, variation in the orientation of the [001] crystal axis can produce variation in mechanical behavior of parts. Therefore, it has become a general object to achieve more close alignment of the [001] axis, or other crystal axis of the material, with the chosen part axis. It has been found that the accuracy and consistency of alignment obtainable using the starter and helix designs known in the prior art needs improvement.

DISCLOSURE OF INVENTION

An object of the invention is to improve the consistency of alignment of a desired crystal axis with the global axes of a cast article. Specifically, it is an object to reduce the degree of deviation of the [001] crystal axis from the longitudinal z axis of a nickel superalloy part, where the longitudinal axis is the axis along which the solidification interface has been caused to move.

In accord with the invention, the contour of the solidification interface is carefully controlled as it moves through the starter section of the mold. By controlling the heat transfer conditions in the mold, the solidification interface is made more nearly planar, as it moves through the starter, and into the selector section of the mold, during the directional casting of a single crystal part. In the preferred embodiment of the invention, the mold has a starter section which is stepped, and divided into two subsections. The first subsection, nearest to a helical selector section, is of relatively high surface area to volume ratio, compared to the second subsection, abutting the chill plate. The width of the selector section entrance should be smaller than the width of the starter subsection to which it is connected. The volume relationships between the subsections of the foregoing mold are found to be important. The second subsection should be between 52–98% of the volume of the total starter; preferably it is 75–85%. Preferably, the axial length of the first subsection is greater than the axial length of the second subsection.

The bigger lower subsection provides sufficient volume to the starter, so that the molten metal entering therein sufficiently heats the starter. The smaller cross sectional area of the upper subsection of the starter enables more favorable heat transfer conditions, and leads to a more nearly planar interface passing through the upper subsection. It is found, from metallographic examination, that the columnar growth is thereby altered in character, and the growth which reaches the selector section is more nearly aligned with the longitudinal axis of the mold than it would be if a constant cross section starter of equal volume had been used. Conical shaped starters are usable, but preferably the starter has a step of at least 0.6 cm, as it is measured from the adjacent axial wall of the lower subsection. For nickel base superalloys, the starter is preferably of an overall height of about 5 cm, and the first subsection has a height of 1.6–4 cm, while the second subsection has a height of 1.6–2.5 cm. The width of the first upper subsection is between 0.6–1.6 cm, while the width of the second lower subsection is 2.5–5 cm.

The improved configuration starter is efficient, since the overall height of the starter is not substantially increased. The deviation in crystallographic orientation is reduced to about half of its former value, with the invention. And the improved starters are easily and simply manufactured.

BRIEF DESCRIPTION OF DRAWINGS

FIG. 3 is a graph showing crystallographic orientation data, comparing the invention to the prior art practice.

BEST MODE FOR CARRYING OUT THE INVENTION

The invention is described in terms of the casting and directional solidification of single crystal nickel superalloys, such as alloys described in U.S. Pat. Nos. 4,209,348 and 4,222,794, in ceramic molds. However, it will be appreciated that the invention will be applicable to the casting of other materials as well. The general procedures for directional solidification are described extensively in the technical and patent literature, including U.S. Pat. Nos. 3,494,709 to Piearcey, 3,763,926 to Tschinkel, and 4,190,094 to Giamei, the disclosures of which are incorporated by reference.

In the directional solidification process, a solidification interface (defined herein as generally corresponding in shape with the liquidus isotherm) is caused to move through a mold made of refractory ceramic, such as zircon, silica, and alumina or mixtures thereof. Castings may be made with or without the use of a seed crystal, but we address herein castings made without a seed crystal. Generally, the mold is configured so that the solidification interface first produces equiaxed grain growth, then columnar, and then single crystal. These transitions are accomplished by the combination of the motion of the interface and the configuration of the mold through which the interface must pass.

Figure 1:
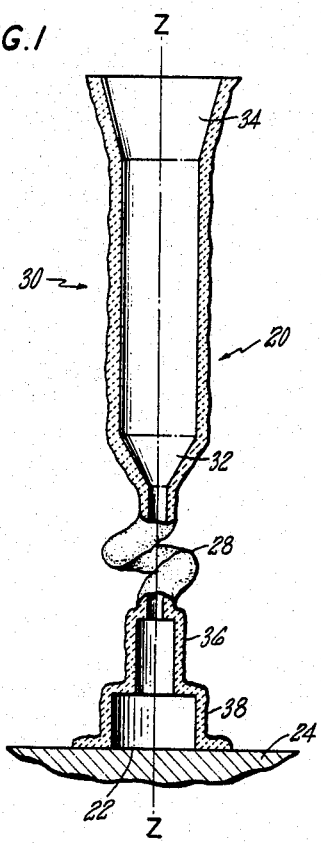
FIG. 1 is a partial vertical section through a mold in accord with the present invention.

FIG. 1 shows a mold 20 having an open end 22, where it rests on a chill plate 24. The mold is comprised of three principal sections: at the base of the mold, nearest the chill plate is the starter section 36. Connected to this is the selector section 28, which in the Figure is shaped as a helix. Connected to the selector section is the article section 30, which comprises a shape defining the desired article. (For the purposes of this specification, the article section 30 is defined as the total portion above the selector section 28. This is done for simplicity of description, since the portion above the selector section is normally comprised of a transition section 32 and a riser section 34. The former is adapted to enable lateral expansion of the single crystal growth which first enters the article section; the latter portion is adapted to provide a reservoir of molten metal during the casting process.)

Typically, molten metal, introduced through the riser into a heated mold, flows through the article and selector sections, and into the starter section, where it contacts the chill plate 24. A portion of it freezes very promptly at the chill plate. Thereafter, the mold is moved relative to the furnace in which it is contained, to cause a thermal gradient to move along the longitudinal axis of the mold, thereby producing columnar grain growth in the starter section. The columnar grain growth interface moves further, from the starter section into the selector. There, the solidification interface velocity vector is caused to rotate as it is projected into a plane transverse to the direction of principal z axis movement, while continuing to move along the z axis. This motion, caused by the helix shape of the selector, converts the columnar grain growth into single crystal grain growth. See co-pending application Ser. No. 343,084, filed Jan. 27, 1982, having common assignee herewith, the disclosure of which is hereby incorporated by reference.

Figure 4:
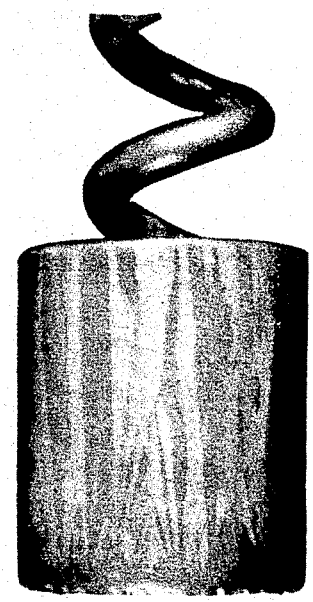
FIG. 4 is a photograph of cast metal removed from the starter of a prior art mold, etched to show the columnar grain growth.

A great number of castings have been made according to the prior art, using molds with a simple cylinder starter, as shown in FIG. 4. When a face centered cubic nickel superalloy is directionally cast, the [001] crystal axis will be found to lie generally parallel to the direction of grain growth, or parallel to the z axis of the article in the FIG. 1 mold. However, investigation has shown that there is a variability in the alignment, based on the casting of a large number of molds. The causes for this variability have not been readily apparent. But with the understanding produced by the invention herein, it is now apparent that misoriented, or tilted, columnar grains can enter a helix selector, and be propagated through the selector, to produce a single columnar grain (crystal) which is misoriented. Thus, the problem became how to decrease the casting variability produced in the starter section.

Figure 2:
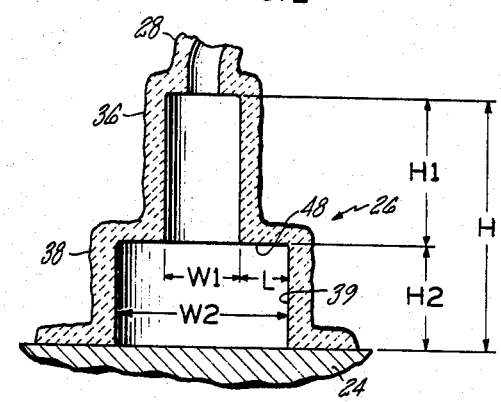
FIG. 2 is a more detailed view of the starter section of the mold shown in FIG. 1.

FIG. 1 shows a starter section with a stepped configuration, which decreases crystallographic misorientation. The starter section, shown in more detail in FIG. 2, is seen to be comprised of a first subsection 36 and a second larger subsection 38, nearer the chill plate. There is a step 48 in the starter, at the junction of the two subsections. The step is a part of the mold transverse to the axis, extending a distance L radially inward from the outer wall 39 of the larger subsection 38.

When castings were made using the FIGS. 1-2 configuration mold, substantial improvement was noted. This is illustrated by the data discussed just below. We compared articles made using a straight cylindrical starter of about 3.2 cm diameter and 4 cm height with those made using a preferred starter of our invention which had an overall z axis length H of about 4 cm, with a first subsection 36 having a length H1 of about 2.5 cm, and a diameter of about 1.3 cm, and a second subsection 38 with a length H2 of about 1.6 cm, and a diameter of about 3.2 cm. Each of the starters had an attached helical selector of approximately 2 turns, the helix having a helical diameter of about 1 cm, a pitch of about 2 cm, and a passage diameter of about 0.7 cm, as in the aforementioned application Ser. No. 343,084.

Figure 5:
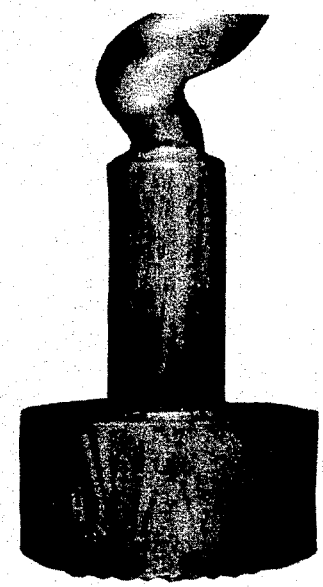
FIG. 5 is similar to FIG. 4, showing the metal casting from a starter in accord with the invention.

The crystallographic orientations of the U.S. Pat. No. 4,222,794 type alloy castings were measured at the center of a transverse plane near the center of the article, using Laue X-ray diffraction techniques. The orientation was characterized by measuring the angle between [001] crystal axis and the z axis of the part. As those familiar with the Laue method know, x and y deviations are measured, and these can be resolved to an angular value, stated here in degrees. The data, shown in FIG. 3, reveal that the invention greatly reduces the scatter in orientation. And the median of the crystallographic orientation is brought more nearly to zero deviation, from about 9 degrees, to about 4.5 degrees. FIG. 4 shows the etched grain structure typical of a starter of the prior art, it is seen that it is coarse and runs generally vertical. FIG. 5 shows by comparison the grain structure in a starter of the invention. The grain structure in the large lower subsection is analogous with the FIG. 4 structure at the same distance from the bottom. But, the grain in the small diameter upper subsection is much more refined and runs vertically.

Figure 6:
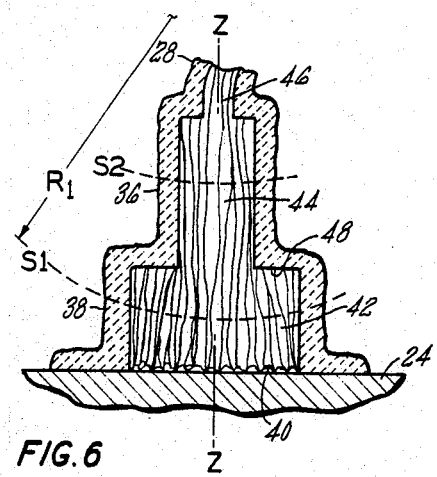
FIG. 6 is similar to FIG. 2, but depicts the metallurgical structure along a vertical cross section of a casting, such as is shown in FIG. 5, when it is still contained in the mold.

FIG. 6 helps illustrate our understanding of why the crystallographic improvement results from the invention. Shown in the Figure is a centerline cross section of the metal which has solidified inside a step starter. The grain structure is shown; this is distinct from the crystallographic structure, but experience shows that in the face centered cubic nickel alloys, the [001] crystal axis is generally aligned with the direction of substantial grain growth. In the Figure it is seen that the metal 40 which contacts the chill plate has essentially an equiaxed structure. The metal 42 which solidifies in the lower and larger subsection 38 is typical columnar grain growth, initiating from the equiaxed grains 40 and caused by motion of a thermal gradient through the molten metal in the mold. Within the columnar growth metal 42, there is a crowding out of the less preferred orientations (i.e., those other than [001]) by the more rapid growing [001] grains. The line S1 represents the nominal shape of the solidification interface as it appears when moving through the lower subsection 38. It is seen to be concave, with a nominal radius R1. The shape of the solidification interface is determinable both by computation (see U.S. Pat. No. 4,190,094 to Giamei) and by the columnar grain growth pattern which generally is perpendicular to the solidification interface. The columnar grain growth is seen to be sloped inwardly at the outer dimensions of the casting 42 in the subsection. (The shape of the solidification interface is not often exactly known since there are complex heat transfer phenomena near the chill plate. It is known that the interface is curved upward at its edges in the typical starter; i.e., the edges are higher than the average height, as evidenced by inward tilting columns. However the interior may be more complexly contoured. We present here a simplified explanation reflecting our best understanding, to illustrate the principles of the invention, as they are reflected in the casting results.)

The grain structure of the metal 44 in the smaller upper subsection 36 has a different appearance. It is seen that the grains are more aligned with the z axis of the mold, and this corresponds with a solidification interface S2 which is more nearly planar, than the solidification interface which is attained in the larger lower subsection of the starter.

A concave shape of the solidification interface is a characteristic of high rates of directional solidification, where the primary heat extraction is from the exterior surface of the mold. Therefore, based on our analysis of the results from our improved starter, the smaller lateral dimension of the upper subsection produces a more nearly planar solidification interface, and thereby provides a crystallographic orientation which is more nearly aligned with the z axis, when the solidification interface enters the opening 46 of the selector section 28.

Thus the general mode of our invention is that the solidification interface is made more nearly planar, before it enters the helix. When the interface is more planar, the columnar [001] growth is more nearly aligned with the z axis. We achieve this by effecting more desirable heat transfer conditions, by reducing the diameter of the starter where it is connected to the helix. Other methods of altering heat transfer and effecting the change in interface contour as it moves through the starter may be contemplated.

We regard our stepped cylindrical configuration as the simplest and best mode. Different mold configurations can carry out the object of the invention, if the surface area to volume ratio of an upper portion of the starter is greater than the surface area to volume ratio of the lower portion of the mold. By surface area, we mean the inner circumference of the mold, multiplied by a unit length of section. By volume, we mean the interior volume of the unit length section.

Referring again to FIG. 2, we have discovered the cylindrical starter proportions usable in our invention. The overall height H should be 4-5 cm. Greater heights will work, but they are undesirable, as indicated above. The height H2 of the lower subsection should be about 1.6-2.5 cm, preferably 1.6 cm; the height H1 of the upper subsection should be about 1.6-4 cm, preferably 2.5 cm. The diameter W2 of the lower subsection should be about 2.5-5 cm, preferably 3.2 cm. Larger W2 diameters can be used, but a practical limit will be approached, where the lateral dimension of the starter becomes much bigger than the lateral dimension of common articles. Smaller W2 is preferred, to use less metal. It is important that the diameter W1 of the upper subsection not be too big; it should be about 0.6-1.6 cm, preferably 1.3 cm. If the width W1 becomes too great, then the desired improvement in crystallographic structure will not occur. If W1 becomes too small, then the mold structure becomes fragile and additional support means have to be used. It appears that somewhat poorer orientation results for W1 of 1 cm or less, for reasons not yet apparent. In addition, the selector section passageway should be smaller in transverse dimension than the abutting subsection of the starter, to further improve crystallographic quality in allowing the minimum number of columns to enter the starter. This requirement will limit the minimum W1 dimension further since, practically speaking, a helix generally should be at least 0.6 cm in diameter.

The volumetric relationship between the upper starter subsection and the lower subsection is important. Under practically any circumstance, the starter section of the mold will be colder on average, than the rest of the mold. Sensible heat is imparted to the starter section by the molten metal which is flowed into it upon filling of the mold. For this reason, it is necessary to have sufficient volume in the starter to receive surplus molten metal, and thus prior art cylindrical starters have necessarily been of the order of 2.5 or more cm in height and diameter. A starter having simply a smaller uniform lateral dimension (diameter) would not work effectively, unless it were made sufficiently long. But starters of small width and great height are inefficient, in reducing the utility of a furnace and making flimsy the mold construction.

Thus it is that we have our stepped starter with a larger subsection to provide the desired volume. According to our invention the starter will have a volume of at least about 8.4 mm$^3$. The volume of the lower subsection must be 52-98%, and preferably 75-85% of the total volume of the starter. For the extreme case, where the lower subsection is very large and long, the upper subsection is small in diameter and length, the lower section will be 98% of the volume of the total starter. The 52% value represents the reverse situation, using the dimensions we set forth above. It may be stated as a corollary that the upper subsection should be between 2-48% of the total volume of the starter cavity.

Figure 7:
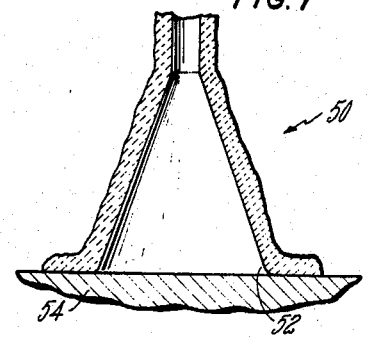
FIG. 7 is similar to FIG. 2, showing a conical shaped starter section.
Figure 8:
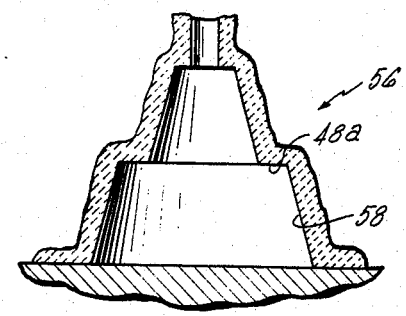
FIG. 8 is similar to FIG. 7, showing a conical starter with a horizontal step.

Molds which have square, rectangular, oblong, or other cross sections can be utilized. They will best have the average dimensions we give above for cylindrical starters. A starter section 50 which is in the shape of a cone, as shown in FIG. 7, tapering inwardly from the end 52 where it contacts the chill plate 54, appeared to produce improved results. However, the improvement was less than our preferred embodiment produced. We believe it is important to have a lateral portion 48a, that is, a step as shown in FIG. 8, for the tapered starter section 56. There is commonly extraneous nucleation (growth which is not epitaxial from the typical columnar growth such as shown at 42 in FIG. 6) at the outer periphery of the starter, at the mold walls 58, especially near the chill plate. When there is a cone without a step, there is a tendency for the extraneous nucleation to propagate towards the selector section. Our experiments have shown that the step in straight sided starters should be at least 0.6 cm wide, as measured on the radius transverse to the z axis (and shown as L in FIG. 2).

The general thermodynamic principles in directional solidification which we reveal may be useful in columnar growth castings, where a single crystal is not desired. They also may be useful with seeding as well, inasmuch as our techniques essentially reduce crystallographic variation at any solidification interface. Although this invention has been shown and described with respect to a preferred embodiment, it will be understood by those skilled in the art that various changes in form and detail thereof may be made without departing from the spirit and scope of the claimed invention.

We claim:

1. A mold for casting a single crystal article, the mold having an article section and a starter section connected together by a selector section which is smaller in cross sectional area than the connected sections; the sections aligned along a vertical axis; the starter section having a first end subsection connected to the selector section, and an opposing second end subsection having a surface area to volume ratio less than that of the first end subsection.

2. The mold of claim 1 wherein the axial length of the first subsection is greater than the axial length of the second subsection.

3. The mold of claim 1 characterized by a step in the starter, between the first and second subsections, the step comprising a portion of the mold extending transversely to the vertical axis.

4. The mold of claim 3 characterized by a step having a length L of at least 0.6 cm as measured from the adjacent axial wall of the subsection at the second end.

5. The mold of claim 1 characterized by a selector section which is comprised of a helix.

6. The mold of claim 1 characterized by a refractory ceramic mold suited for containing molten face centered cubic superalloy, having a starter with an overall height of about 5 cm, comprised of a first subsection with a height H1 of 1.6-4 cm, and a width W1 of 0.6-1.6 cm, a second subsection with a height H2 of 1.6-2.5 cm and a width W2 of 2.5-5 cm.

* * * * *